United States Patent
Lee et al.

(10) Patent No.: US 8,658,541 B2
(45) Date of Patent: Feb. 25, 2014

(54) METHOD OF CONTROLLING TRENCH MICROLOADING USING PLASMA PULSING

(75) Inventors: Gene H. Lee, San Jose, CA (US); Chansyun David Yang, San Jose, CA (US); Liming Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 12/886,247

(22) Filed: Sep. 20, 2010

(65) Prior Publication Data
US 2011/0177669 A1 Jul. 21, 2011

Related U.S. Application Data

(60) Provisional application No. 61/295,275, filed on Jan. 15, 2010.

(51) Int. Cl.
*H01L 21/761* (2006.01)

(52) U.S. Cl.
USPC .......................................... 438/707

(58) Field of Classification Search
USPC .................. 438/778, 689, 694, 706–707; 257/E21.54, E21.546
See application file for complete search history.

(56) References Cited

U.S. PATENT DOCUMENTS

| | | | | |
|---|---|---|---|---|
| 5,468,341 A * | 11/1995 | Samukawa | | 216/69 |
| 2002/0052111 A1 | 5/2002 | Paterson et al. | | |
| 2002/0189761 A1* | 12/2002 | Hedberg et al. | | 156/345.44 |
| 2003/0153195 A1* | 8/2003 | Weikmann et al. | | 438/714 |
| 2003/0211754 A1* | 11/2003 | Donohoe | | 438/729 |
| 2004/0097077 A1* | 5/2004 | Nallan et al. | | 438/689 |
| 2004/0124177 A1 | 7/2004 | Urban et al. | | |
| 2005/0112891 A1* | 5/2005 | Johnson et al. | | 438/691 |
| 2005/0145949 A1* | 7/2005 | Sadra et al. | | 257/368 |
| 2005/0158965 A1* | 7/2005 | Bai et al. | | 438/424 |
| 2007/0193975 A1* | 8/2007 | Wilson | | 216/59 |
| 2008/0099148 A1* | 5/2008 | Ryabova et al. | | 156/345.48 |
| 2008/0197110 A1* | 8/2008 | Kim et al. | | 216/67 |
| 2008/0206900 A1* | 8/2008 | Kim et al. | | 438/9 |
| 2008/0206901 A1* | 8/2008 | Kim et al. | | 438/9 |
| 2009/0142859 A1* | 6/2009 | Liu et al. | | 438/8 |
| 2009/0170333 A1 | 7/2009 | Sasano et al. | | |
| 2010/0105209 A1* | 4/2010 | Winniczek et al. | | 438/696 |
| 2010/0176479 A1* | 7/2010 | Postnikov et al. | | 257/499 |

FOREIGN PATENT DOCUMENTS

KR 2009030504 A * 3/2009

OTHER PUBLICATIONS

International Search Report and Written Opinion mailed Sep. 9, 2011 for PCT Application No. PCT/US2010/061976.

* cited by examiner

*Primary Examiner* — Michele Fan
(74) *Attorney, Agent, or Firm* — Moser Taboada; Alan Taboada

(57) ABSTRACT

Methods and apparatus for controlling microloading, such as within cell microloading between adjacent cells or isolated/dense microloading between areas of isolated or dense features during shallow trench isolation (STI) fabrication processes, or other trench fabrication processes, are provided herein. In some embodiments, a method for fabricating STI structures may include providing a substrate having a patterned mask layer formed thereon corresponding to one or more STI structures to be etched; etching the substrate through the patterned mask layer using a plasma formed from a process gas to form one or more STI structure recesses on the substrate; and pulsing the plasma for at least a portion of etching the substrate to control at least one of a depth or width of the one or more STI structure recesses.

15 Claims, 3 Drawing Sheets

METHOD OF CONTROLLING TRENCH MICROLOADING USING PLASMA PULSING

CROSS-REFERENCE TO RELATED APPLICATIONS

This application claims benefit of U.S. provisional patent application Ser. No. 61/295,275, filed Jan. 15, 2010, which is herein incorporated by reference.

FIELD

Embodiments of the present invention generally relate to semiconductor substrate processing, and more specifically, to methods of fabricating shallow trench isolation (STI) cells.

BACKGROUND

One challenge of fabricating, or etching, shallow trench isolation (STI) features in a substrate is microloading between regions of dense features and regions of isolated features. Microloading manifests itself as differences in feature profile and etch depth between regions of high feature density and regions of low feature density on a substrate in which the features are being etched. For example, regions of low feature density may etched to a depth that is different than an etch depth corresponding to the regions of high feature density.

As an example, the inventors have observed that, for certain devices, such as advanced node devices (e.g., sub 40 nm), there may be variation in critical dimension (CD) spacing of features from cell to cell which can result in STI depth variation corresponding to the varying CD. As another example, for Flash memory devices that require patterning at very small device nodes, there is a need to pattern with a self-aligned double patterning (SADP) processes due to litho limitations. However, the inventors have observed that, due to the SADP processes, there may be a variation in the CD spacing from feature to feature, which results in an alternating, bi-modal (or random) depth variation from feature to feature due to microloading. For DRAM devices the inventors have observed that there is also a microloading effect between storage node contact (SNC) and buried node contact (BNC) areas.

Thus, the inventors have provided improved methods for fabricating STI structures that may provide improved control over etch depth microloading.

SUMMARY

Methods and apparatus for controlling microloading, such as within cell microloading between adjacent cells or isolated/dense microloading between areas of isolated or dense features during shallow trench isolation (STI) fabrication processes, or other trench fabrication processes, are provided herein. In some embodiments, a method for fabricating STI structures may include providing a substrate having a patterned mask layer formed thereon corresponding to one or more STI structures to be etched; etching the substrate through the patterned mask layer using a plasma formed from a process gas to form one or more STI structure recesses on the substrate; and pulsing the plasma for at least a portion of etching the substrate to control at least one of a depth or width of the one or more STI structure recesses.

Other embodiments and variations are disclosed below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
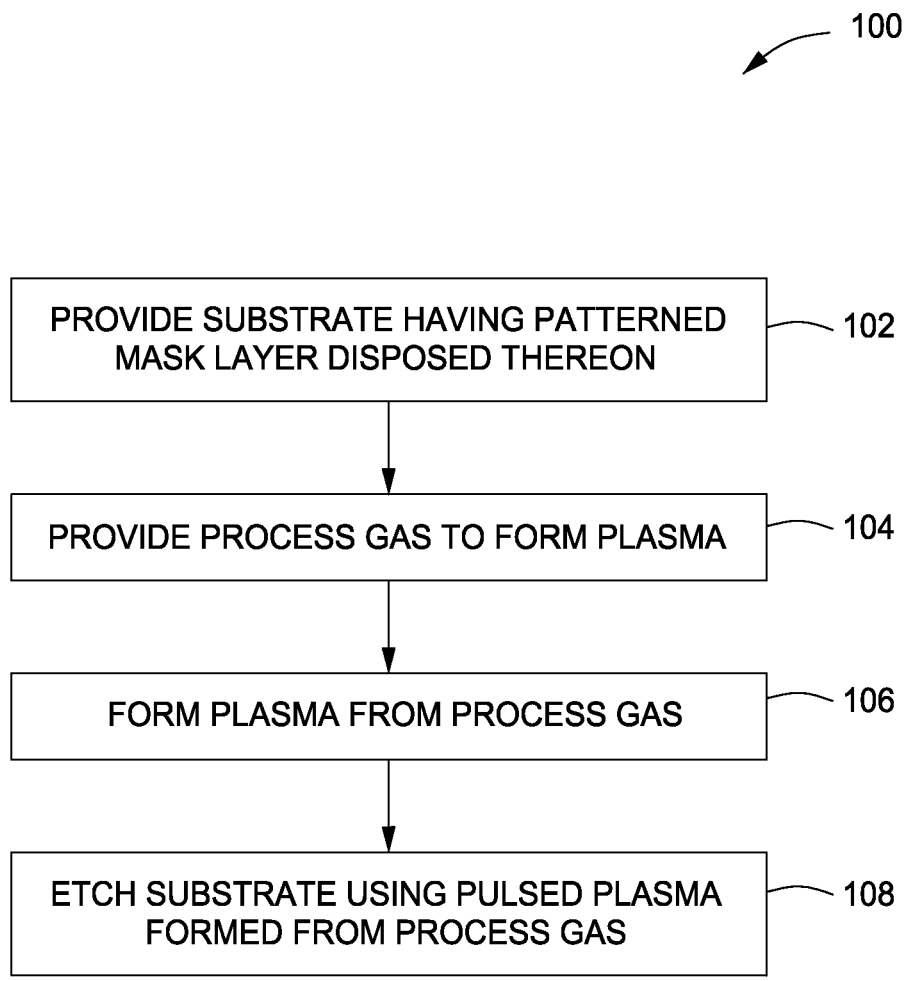
FIG. 1 is a flow diagram of a method for fabricating shallow trench isolation (STI) structures in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for fabricating shallow trench isolation (STI) structures that may provide improved control of microloading between individual features, features and peripheral areas, and regions of dense features and regions of isolated features. In some embodiments, the STI structures formed may be high aspect ratio STI structures. Embodiments of the inventive process may also provide flexibility in control over the STI profile, critical dimension (CD), and/or microloading to meet different requirements for different customer applications. Although not limiting of the scope of application of the inventive methods disclosed herein, the inventive methods have been shown to be particularly effective for both Flash and DRAM devices.

Figure 2A:
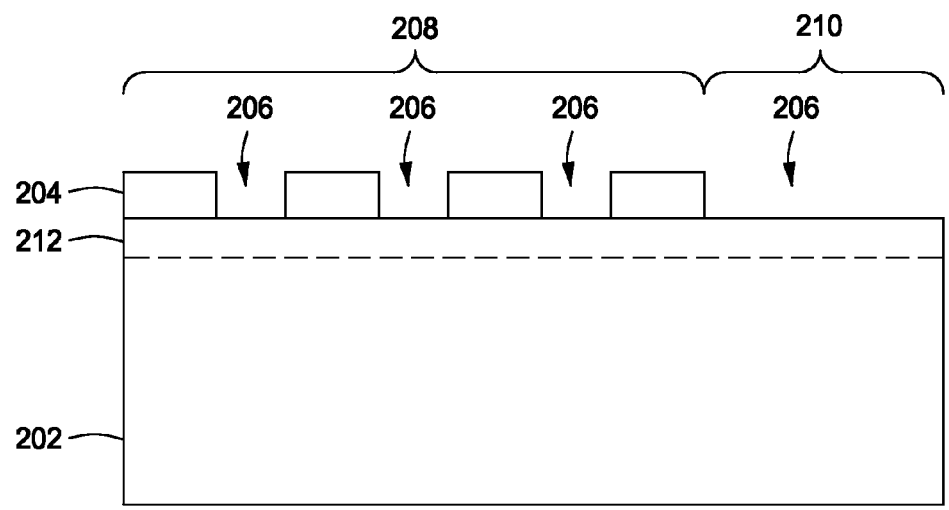
FIGS. 2A-B are illustrative cross-sectional views of a substrate during different stages of the method of FIG. 1 in accordance with some embodiments of the present invention.
Figure 2B:
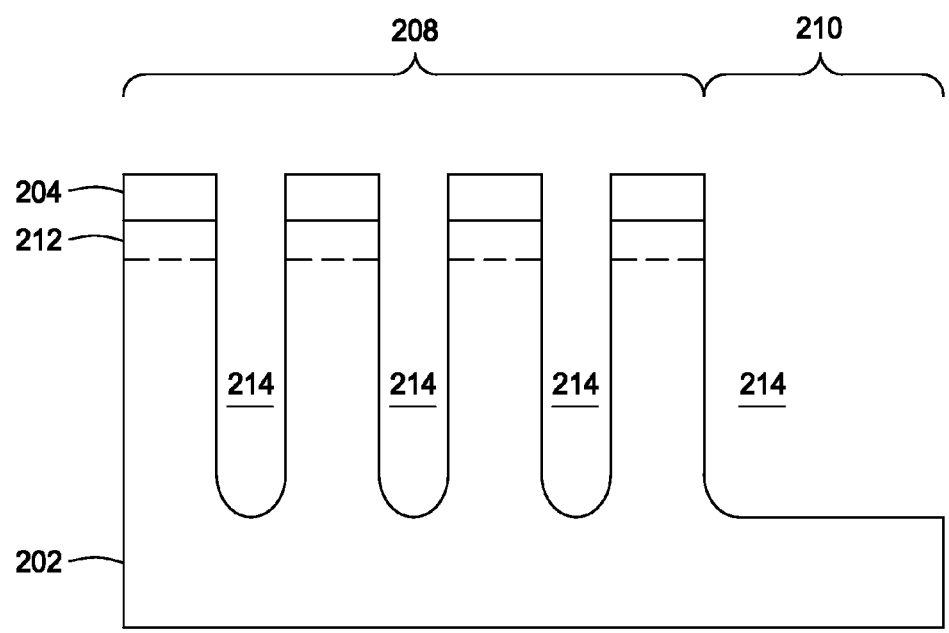

FIG. 1 is a flow diagram of a process 100 for fabricating STI structures in accordance with some embodiments of the present invention. FIGS. 2A-B are illustrative cross-sectional views of a substrate during different stages of the processing sequence of FIG. 1 in accordance with some embodiments of the present invention. The above method may be performed in any apparatus suitable for processing semiconductor substrates in accordance with embodiments of the present invention, such as discussed below with respect to FIG. 3.

The process 100 generally begins at 102 where a substrate 202 having a patterned mask layer 204 disposed thereon is provided, as depicted in FIG. 2A. The substrate 202 may be any suitable substrate, such as a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer.

The patterned mask layer 204 may define one or more features 206 to be etched into the substrate 202. In addition, the patterned mask layer 204 may define separate regions of varying feature density. For example, as depicted in FIG. 2A, the patterned mask layer 204 may define one or more areas of high feature density 208 and one or more areas of low feature density 210.

The patterned mask layer 204 may be any suitable mask layer such as a hard mask or photoresist layer. For example, in embodiments where the patterned mask layer 204 is a hard mask, the patterned mask layer 204 may comprise at least one of oxides, such as silicon dioxide ($SiO_2$), silicon oxynitride (SiON), or the like, or nitrides, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. Alternatively, or in combination, in some embodiments, the mask layer may comprise an amorphous carbon, such as Advanced Patterning Film (APF), available from Applied Materials, Inc., located in Santa Clara, Calif., or a tri-layer resist (e.g., a photoresist layer, a Si-rich anti-reflective coating (ARC) layer, and a carbon-rich ARC, or bottom ARC (BARC) layer), a spin-on hardmask (SOH), or the like. The patterned mask layer 204 may be formed by any process suitable to form a patterned mask layer 204 capable of providing an adequate template for defining STI structures. For example, in some embodiments, the patterned mask layer 204 may be formed via a patterned etch process. In some embodiments, for example where the patterned mask layer 204 will be utilized to define advanced or very small node devices (e.g., about 40 nm or smaller nodes, such as Flash memory devices), the patterned mask layer 204 may be formed via a spacer mask patterning technique, such as a self-aligned double patterning process (SADP).

In some embodiments, one or more intervening layers (such as layer 212) may be disposed between the patterned mask layer 204 and the substrate 202 to facilitate the etch process. In some embodiments, the intervening layer 212 may include a polycrystalline silicon layer and/or a tunnel oxide layer.

Next, at 104, a process gas used to form a plasma may be provided. In some embodiments, the process gas may comprise at least one of a fluorine-containing gas or a fluorocarbon- or hydrofluorocarbon-containing gas as the primary reactive agents. Optionally, the process gas may further comprise at least one of HBr, $Cl_2$, $O_2$, and/or an inert dilutant gas (such as $N_2$, He, Ar, or the like).

In some embodiments, the fluorine-containing gas may comprise gases that can be dissociated to form free fluorine, such as $NF_3$, $SF_6$, $CF_4$, or the like. In some embodiments, a fluorocarbon-containing gas may be provided that comprises gases that dissociate to form F radicals and $CF_x$ (where x is a positive integer), such as $CF_4$, $C_2F_6$, $C_4F_8$, or the like. In some embodiments, a hydrofluorocarbon-containing gas may be provided that comprises gases that dissociate to form F radicals and $CF_x$, as well as that provides hydrogen (H) that combines with the free fluorine in the plasma to increase the C:F ratio (or C:H:F ratio), such as $CH_2F_2$, $CH_4$, $CHF_3$, or the like. The ratio of C:F (or C:H:F) facilitates control of the properties of the plasma (although the bias power supplied also influences this behavior). For example, if the ratio of C:F is high (e.g., 1:4 or greater, such as when using $C_4F_8$), the plasma can provide more passivation source as compared to a plasma formed from a chemistry where the ratio is low (e.g., 1:2 or lower, such as when using $CF_4$). For C:H:F chemistries, the greater the C—H containing chemical bonding, the easier it is to form C—H—F polymer passivation precursor. In some embodiments, the process gas comprises $NF_3$ and $CHF_3$.

In some embodiments, such as where a fluorine-containing gas is used as a primary reactive agent, the fluorine-containing gas may be provided at a flow rate of between about 5 to about 200 sccm. In some embodiments, such as where a fluorocarbon- or hydrofluorocarbon-containing gas is used alternatively or in combination with the fluorine-containing gas as a primary reactive agent, the fluorocarbon- or hydrofluorocarbon-containing gas may be provided at a flow rate of between about 5 to about 200 sccm. It is to be appreciated that the flow rates can be adjusted or varied depending on the chamber used for the particular application without exceeding the scope of the embodiments of the present invention. In some embodiments, the fluorine-containing gas and the fluorocarbon- or hydrofluorocarbon-containing gas may be provided at a flow ratio of fluorine-containing gas to fluorocarbon- or hydrofluorocarbon-containing gas of between about 10:1 to about 1:10. For example, in some embodiments, $CF_4$ and $CHF_3$ may be provided at a ratio of $CF_4$ to $CHF_3$ of between about 10:1 to about 1:10.

Optionally, the process gas may also comprise one or more of hydrogen bromide (HBr), chlorine ($Cl_2$), or oxygen ($O_2$). In some embodiments, HBr may be provided at a flow rate of between about 10 to about 900 sccm, or in some embodiments, about 150 sccm. Alternatively, or in combination, $O_2$ may be provided at a flow rate of between about 2 to about 100 sccm, or in some embodiments, about 15 sccm. In some embodiments, $Cl_2$ may be provided at a flow rate of between about 5 to about 300 sccm, or in some embodiments, up about 15 sccm.

Optionally, a dilutant gas may be provided with the process gas. The dilutant gas may be any inert gas, such as nitrogen ($N_2$), helium (He), Argon (Ar), or the like. In some embodiments, the dilutant gas may be provided at a flow rate of between about 100 to about 500 sccm, or in some embodiments, about 200 sccm.

Next, at 106 a plasma is formed from the process gas. To form the plasma, the process gas may be ignited into a plasma by coupling RF power at a suitable frequency to the process gas within a process chamber under suitable conditions to establish the plasma. For example, in some embodiments, a plasma power source of up to about 3000 W, or between about 500-1500 W, or about 1000 W, at a frequency in a range from 50 KHz to 13.56 MHz may be provided to an inductively coupled antenna of the process chamber to ignite and maintain the plasma. In some embodiments, up to about 500 W, or between about 20-100 W, or about 70 W, of a bias power may be provided, for example, at a frequency of about 13.56 MHz to the substrate via a substrate support. Additional process parameters may be utilized to promote plasma ignition and stability. For example, in some embodiments, the process chamber may be maintained at a temperature of between about 0 to about 150 degrees Celsius during plasma ignition or, in some embodiments, about 20 degrees Celsius. Additionally, in some embodiments, the process chamber may be maintained at a pressure of between about 2 to about 80 mTorr, or in some embodiments, about 50 mTorr.

Next, at 108, the substrate 202 is etched using the plasma formed from the process gas to form one or more features in the substrate, such as STI structure recesses 214, as depicted in 2B. Generally, to facilitate etching, high energy ions from the plasma are accelerated towards the substrate 202, causing material to be ejected from the substrate 202, thereby etching the desired features into the substrate. In some embodiments, the ions may be directed toward the substrate 202 via a self bias formed on the substrate 202 resulting from the application of RF power to the process gas to form the plasma, as discussed above. Alternatively, or in combination, to facilitate directing the ions towards the substrate 202 an additional bias power may be provided to the substrate 202 via a substrate support disposed in a process chamber, for example, such as discussed below with respect to FIG. 3.

Following the ignition and formation of the plasma, and throughout the etch process forming the one or more STI structure recesses 214, the plasma may be pulsed to facilitate control of at least one of a depth or width of the one or more STI structure recesses 214. For example, by pulsing the plasma the etch depth microloading between individual STU structure recesses 214 and between the regions of high feature density 208 and the regions of low feature density 210 can be controlled. For example, the statistical distribution of feature depth variation within a feature cell, or between feature cells, may be improved from a bimodal distribution to a normal Gaussian distribution, thus resulting in better cell loading control and an improved and predictable device performance. In other words, the in-coming CD variation induced by the double patterning process can be controlled by the inventive plasma pulsing method during STI etch as described herein to attain a more uniform trench depth. In addition, the sidewall profile in the regions of high feature density 208 and the regions of low feature density 210 may be controlled.

In some embodiments, the plasma pulse mode may be controlled to facilitate control over the depth or width of STI structure recesses 214 during etching processes. For example, the plasma pulse mode may be controlled via pulsing one of the source or bias power provided to ignite and/or maintain the plasma. In some embodiments, both the source and bias power are pulsed to facilitate pulsing the plasma. In such embodiments, the source and bias power may be pulsed in synchronization, e.g., each signal is in phase and has the same duty cycle, or out of phase with respect to one another. In embodiments where the source and bias power is pulsed out of phase, the respective source and bias power signals may be phase shifted up to about 180 degrees with respect to one another.

Alternatively, or in combination, in some embodiments, the pulsing condition, (e.g., the duty cycle or pulse frequency) may be varied to facilitate control over the depth or width of STI structure recesses 214 during etching processes. For example, in some embodiments the duty cycle of the power provided to plasma (bias and/or source power) may be varied to facilitate the plasma pulsing. In such embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy, thereby allowing an increased level of diffusion and removal of etch byproduct, thus allowing a more efficient and controllable etch. In some embodiments, the duty cycle may be between about 10 to about 90 percent, or in some embodiments, about 25 percent, or in some embodiments, about 40 percent.

Alternatively, or in combination, in some embodiments, the pulse frequency, e.g., the frequency of one "on/off" cycle, may be varied to control the plasma pulsing. For example, in some embodiments the pulse frequency may be between about 200 Hz to about 100 kHz, or in some embodiments, about 1 kHz, or in some embodiments, about 5 kHz.

In addition, in some embodiments, the length of time of the plasma is pulsed may be varied to further facilitate control over the over the depth or width of STI structure recesses 214 during etching processes. For example, the plasma may be maintained in a continuous wave for a first period of time, followed by a period of time during which the plasma is pulsed. For example, in some embodiments, after ignition and stabilization of the plasma, as described above, the plasma may then be pulsed by the above methods for a period of about 3 to about 300 seconds. In addition, in some embodiments, plasma pulsing period may be followed by another period of time wherein the plasma is provided in a continuous wave. This continuous wave/plasma pulsing cycle may be sequentially performed any number of times suitable to achieve adequate etching of the STI structure recesses 214.

Upon completion of etching the substrate 202 to form one or more STI structure recesses 214 at 108, the process generally ends and the substrate may continue to be processes as desired. For example, the STI structure recesses 214 may be filled with an appropriate material, such as silicon oxide, to form one or more STI structures.

The processes described herein may be performed in an integrated etch processing system (e.g., a cluster tool) that includes a vacuum transfer chamber having processing chambers coupled thereto that are suitable for etching materials present in the substrate, such as silicon and, optionally, metal, polysilicon, and high-k material layers present in, for example, a gate film stack. The processes described herein may also be performed in other integrated etch processing systems.

Figure 3:
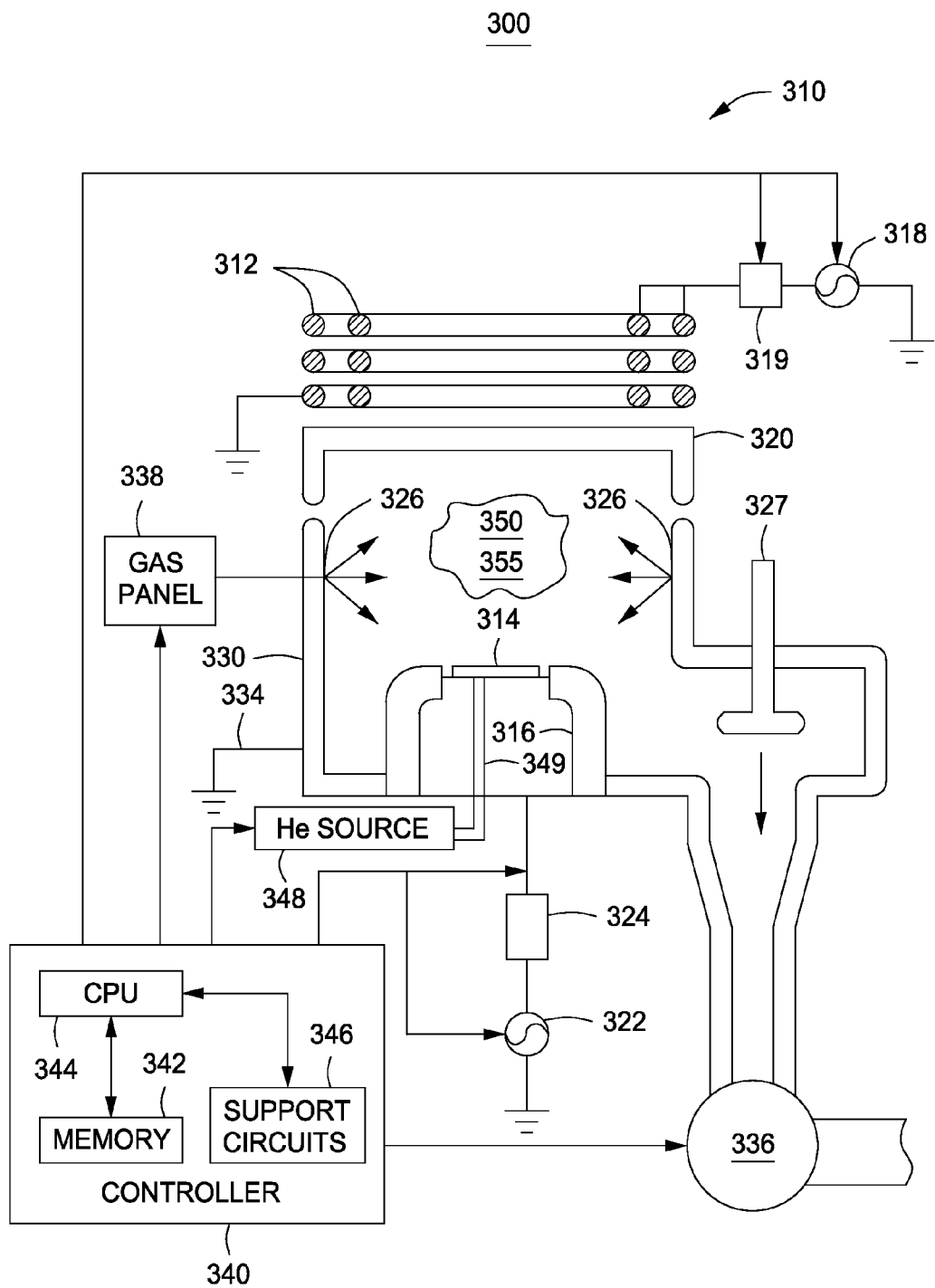
FIG. 3 depicts an etch reactor suitable for performing portions of the present invention.

For example, FIG. 3 depicts a schematic diagram of an illustrative etch reactor 300 of the kind that may be used to practice embodiments of the invention as discussed herein. The etch reactor 300 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 300 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other etch reactors and/or cluster tools may suitably be used as well.

The etch reactor 300 comprises a chamber 310 having a substrate support (cathode) 316 within a conductive body (wall) 330, and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown). The inductive coil element 312 is coupled to a plasma power source 318 through a first matching network 319. The plasma power source 318 typically is capable of producing up to 3000 W at a tunable frequency in a range from 50 KHz to 13.56 MHz. The plasma power source 318 may be operable in a continuous wave (CW) or pulsed mode. When in pulse mode, the plasma power source 318 may be pulsed at a pulse frequency of up to about 100 KHz, or in some embodiments, between about 100 Hz to about 100 KHz. The plasma power source 318 may be operated at a duty cycle (e.g., the percentage of on time during the total of on time and off time in a given cycle) of between about 10% and about 90%.

The substrate support 316 is coupled, through a second matching network 324, to a biasing power source 322. The biasing power source 322 generally is capable of producing up to 1500 W at a frequency of approximately 13.56 MHz. The biasing power may be either continuous or pulsed power. In other embodiments, the biasing power source 322 may be a DC or pulsed DC source. The biasing power source 322 may be operable in a continuous wave (CW) or pulsed mode. When in pulse mode, the biasing power source 322 may be pulsed at a pulse frequency of up to about 100 kHz, or in some embodiments, between about 100 Hz to about 100 KHz. The biasing power source 322 may be operated at a duty cycle (e.g., the percentage of on time during the total of on time and off time in a given cycle) of between about 10% and about 90%.

A controller 340 comprises a central processing unit (CPU) 344, a memory 342, and support circuits 346 for the CPU 344 and facilitates control of the components of the chamber 310 and, as such, of the etch process, as discussed below in further detail.

In operation, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode 316, respectively. The pressure within the interior of the chamber 310 is controlled using a throttle valve 327 and a vacuum pump 336. Typically, the wall 330 is coupled to an electrical ground 334. The temperature of the wall 330 is controlled using liquid-containing conduits (not shown) that run through the wall 330.

The temperature of the substrate 314 is controlled by stabilizing a temperature of the substrate support 316. In one embodiment, the helium gas from a gas source 348 is provided via a gas conduit 349 to channels (not shown) formed in the pedestal surface under the substrate 314. The helium gas is used to facilitate heat transfer between the substrate support 316 and the substrate 314. During processing, the substrate support 316 may be heated by a resistive heater (not shown) within the pedestal to a steady state temperature and then the helium gas facilitates uniform heating of the substrate 314. Using such thermal control, the substrate 314 may be maintained at a temperature of between about 0-650 degrees Celsius.

Other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and subprocessors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method described herein is generally stored in the memory 342 as a software routine. The software routine may also be stored and/or executed by a second CPU (not shown) that is remotely located from the hardware being controlled by the CPU 344.

The invention may be practiced using other semiconductor substrate processing systems wherein the processing parameters may be adjusted to achieve acceptable characteristics by those skilled in the art by utilizing the teachings disclosed herein without departing from the spirit of the invention.

Thus, shallow trench isolation (STI) structures and methods of fabrication have been provided herein. Pulsing of the plasma used to etch the substrate, as described above, facilitates control over the depth and width of the STI structures. The inventive processes further may advantageously provide STI structure formation with improved control over inter and intra cell microloading.

While the foregoing is directed to embodiments of the present invention, other and further embodiments of the invention may be devised without departing from the basic scope thereof.

The invention claimed is:

1. A method for fabricating shallow trench isolation (STI) structure recesses, comprising:
   providing a substrate having a patterned mask layer formed thereon corresponding to one or more STI structure recesses to be etched;
   etching the substrate through the patterned mask layer using a plasma formed from a process gas to form the one or more STI structure recesses on the substrate, wherein the one or more STI structure recesses comprises a plurality of first STI structure recesses grouped into a first region having a first density and a plurality of second STI structures recess grouped into a second region having a second density, wherein the second density is greater than the first density, and wherein the process gas and a source power used to form the plasma are continuously provided while etching the substrate through the patterned mask layer; and
   pulsing the plasma by pulsing a bias power provided to a substrate support for at least a portion of etching the substrate to control a width of the one or more STI structure recesses, wherein a ratio of an etch depth of the first STI structure recesses in the first region to an etch depth of the second STI structure recesses in the second region is controlled by pulsing the bias power.

2. The method of claim 1, wherein the bias power is pulsed at a pulse frequency of about 200 Hz to about 100 kHz.

3. The method of claim 1, wherein the bias power is pulsed at a duty cycle of about 10% to about 95%.

4. The method of claim 1, wherein at least one of the bias power or source power is an RF signal or DC signal.

5. The method of claim 1, wherein the bias power is provided at a power between about 100 to about 900 W and at a frequency between about 400 kHZ to about 600 MHz.

6. The method of claim 1, wherein the source power is provided at a power between about 300 to about 2000 W.

7. The method of claim 1, wherein pulsing the plasma further comprises:
   maintaining the plasma continuously for a first period of time; and
   pulsing the plasma for a second period of time.

8. The method of claim 7, wherein the first period of time is about 3 to about 300 seconds and the second period of time is about 3 to about 300 seconds.

9. The method of claim 1, wherein the patterned mask layer corresponds to a node size of about 40 nm or smaller and is formed via a self aligned double patterning process.

10. The method of claim 1, further comprising:
    etching each of the first and second STI structure recesses to a substantially equivalent depth.

11. The method of claim 1, wherein the substrate further comprises:
    one or more intervening layers disposed between the substrate and the patterned mask layer.

12. The method of claim 11, wherein at least one layer of the one or more intervening layers comprises polysilicon.

13. The method of claim 1, wherein the patterned mask layer comprises carbon.

14. The method of claim 1, wherein the process gas comprises at least one of a fluorine-containing, a fluorocarbon-containing gas or a hydrofluorocarbon-containing gas.

15. The method of claim 14, wherein the process gas further comprises an inert gas, wherein the inert gas comprises at least one of nitrogen ($N_2$), helium (He), or argon (Ar).

* * * * *

UNITED STATES PATENT AND TRADEMARK OFFICE
CERTIFICATE OF CORRECTION

| | | |
|---|---|---|
| PATENT NO. | : 8,658,541 B2 | Page 1 of 1 |
| APPLICATION NO. | : 12/886247 | |
| DATED | : February 25, 2014 | |
| INVENTOR(S) | : Lee et al. | |

It is certified that error appears in the above-identified patent and that said Letters Patent is hereby corrected as shown below:

In the Claim

Column 8, line 40, Claim 5, delete the phrase "about 400 kHZ to about 600 MHz" and substitute therefor --about 400 kHZ to about 60 MHz--.

Signed and Sealed this
Twenty-seventh Day of May, 2014

Michelle K. Lee
*Deputy Director of the United States Patent and Trademark Office*